United States Patent [19]

Oritani

[11] Patent Number: 4,563,598

[45] Date of Patent: Jan. 7, 1986

[54] LOW POWER CONSUMING DECODER CIRCUIT FOR A SEMICONDUCTOR MEMORY DEVICE

[75] Inventor: Atushi Oritani, Yokohama, Japan

[73] Assignee: Fujitsu Limited, Kanagawa, Japan

[21] Appl. No.: 453,915

[22] Filed: Dec. 28, 1982

[30] Foreign Application Priority Data

Dec. 28, 1981 [JP] Japan .................. 56-209754

[51] Int. Cl.$^4$ ............. H03K 19/096; H03K 17/06
[52] U.S. Cl. ...................... 307/449; 307/443; 307/453; 307/481; 307/482; 307/463; 307/279
[58] Field of Search ........... 307/443, 448, 449, 453, 307/463, 481, 482, 548, 550, 279, 480, 269; 365/227

[56] References Cited

U.S. PATENT DOCUMENTS

| 4,086,500 | 4/1978 | Suzuki et al. | 307/449 |
| 4,099,265 | 7/1978 | Abe | 307/279 X |
| 4,185,320 | 1/1980 | Takemae et al. | 307/463 |
| 4,398,102 | 8/1983 | Stewart | 307/449 |
| 4,471,240 | 9/1984 | Novosel | 307/463 |

FOREIGN PATENT DOCUMENTS

| 0017990 | 10/1980 | European Pat. Off. |
| 50-117325 | 9/1975 | Japan |
| 51-128234 | 11/1976 | Japan |
| 54-80041 | 6/1979 | Japan |
| 54-152930 | 12/1979 | Japan |
| 1505812 | 3/1978 | United Kingdom |

OTHER PUBLICATIONS

IEEE International Solid-State Circuits Conference, vol. 20, No. 20, Feb. 1977, pp. 14–15, New York, USA. T. R. O'Connell et al., "A4K Static Clocked and Non-clocked RAM Design".
Patent Abstract of Japan, vol. 5, No. 134(P-77) (806), Aug. 26, 1981 & JP-1-56 71881 (Fujitsu K.K.) 15-06-1981.

*Primary Examiner*—Stanley D. Miller
*Assistant Examiner*—D. R. Hudspeth
*Attorney, Agent, or Firm*—Armstrong, Nikaido, Marmelstein & Kubovcik

[57] ABSTRACT

The present invention is directed to a decoder circuit for a semiconductor memory device including a logic circuit for receiving an address signal as an input thereto and selecting an address in response thereto and a load in the logic circuit. The load comprises a pair of transistors connected in parallel, wherein one of the pair of transistors turns ON for a specified period in synchronization with the address signal, and the other of the pair of transistors turns ON when the logic circuit is in a selected condition and turns OFF when the logic circuit is in a non-selected condition.

5 Claims, 21 Drawing Figures

Fig. 7B $\overline{A}_o$ 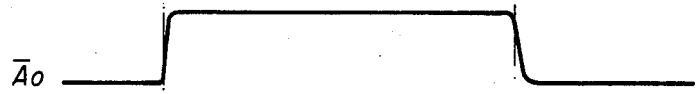
Fig. 7C $A_o$ 
Fig. 7D $B_o$ 
Fig. 7E $C_o$ 
Fig. 7F $D_o$ 
Fig. 7G $E_o$ 
Fig. 7H $F$ 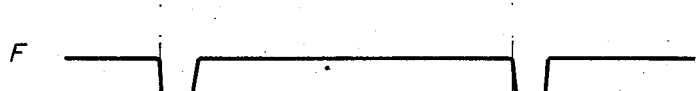
Fig. 7I $G$ 

LOW POWER CONSUMING DECODER CIRCUIT FOR A SEMICONDUCTOR MEMORY DEVICE

BACKGROUND OF THE INVENTION

1. Field of the Invention

This invention relates to a decoder circuit for use in semiconductor memory devices such as MOS static RAMs etc., and more particularly, to a decoder circuit which is capable of lowering power consumption of a decoder circuit in a non-selective condition.

2. Description of the Prior Art

In general, various techniques for reducing power consumption in semiconductor memory devices have been attempted, for example, with a known representative method, such as described in *Integrated Scratch Pads Sire New Generation of Computers, Electronics*, Apr. 4, 1966, pages 118–126, wherein power consumption of the peripheral circuits is reduced by disconnecting the control signal power supply lines from the peripheral circuits (including decoder circuit, write circuit, read circuit) of the non-selected memory cells. The aforementioned control signal is sometimes called the chip select signal and is used for the control which connects the power supply line to the peripheral circuit of the selected memory chip. However, only one bit or several bits of the memory cells are actually selected in the selected memory chip and the decoder circuit to be selected therewith also functions as a decoder for one or more bits. Other decoder circuits are all in a non-selected condition. The decoder circuit is generally a NOR gate in the MOS static RAM etc., resulting in large power consumption in the non-selected condition and this problem is not solved even using the power saving techniques of the above-mentioned chip select signal.

FIG. 1 outlines a known static RAM in which the static memory cell array 1 is comprised of the N×M memory cells arranged in the form of a matrix. The word decoder 2 selects any one of the word lines $X_0$ to $X_{(N-1)}$, while the column decoder 3 selects any one of the bit lines $Y_0$ to $Y_{(M-1)}$, thereby selecting the cell located at the intersection thereof, making it possible to read data being stored or to write data into the selected cell. Power consumption of such a static RAM becomes significant as memory capacity becomes large and in particular, the word decoder circuit which selects word lines is at a high level when the NOR gate for selecting addresses selects a word line or at a low level when it does not select an address. Consequently, there is always the difficulty of reducing power consumption of the semiconductor memory devices because the decoder circuit consumes more power in the low level than that in the high level and the number of word line selecting circuits in the non-selected condition surpass those in the selected condition.

A circuit shown in FIG. 2 is a typical example of a decoder circuit mentioned above. In this figure, $A_0$ to $A_n$ are address signal inputs; transistors $QA_0$ to $QA_n$ form a NOR gate, while transistor $Q_{11}$ is the load of the NOR gate. The transistor $Q_{13}$ is an inverter, while transistor $Q_{12}$ is the load of the inverter. The transistors $Q_{14}$ and $Q_{15}$ form an output circuit. $V_{cc}$ is a power supply, while $V_{ss}$ is the return side line of the power supply. The transistors shown with the dot in the figure, i.e., the transistors $Q_{11}$ and $Q_{12}$, are depletion type MOS transistors. In the above circuit, since the address signals $A_0$ to $A_n$ are all at a low level when the word line is selected, the output of the NOR gate (point a1) is at a high level and the output of inverter (point a2) becomes low level. This causes the transistor $Q_{14}$ of the output circuit to turn ON while $Q_{15}$ is OFF. The output WD 1 is switched to a high level and since no current flows into the transistor $Q_{15}$ and the transistors $QA_0$ to $QA_n$, this circuit consumes less power. In case a word line is not selected, at least one of the address signals $A_0$ to $A_n$ is at a high level and as a result, the point a1 is at a low level, while the point a2 is at a high level, making the transistor $Q_{14}$ turn OFF, while $Q_{15}$ is ON. In this case, since at least one of transistors $QA_0$ to $QA_n$ is ON, a current flows, consuming power.

The decoder circuit of this conventional type has the disadvantage that it consumes a considerable amount of power because it consumes more power in the non-selected condition of a word line than that in a selected condition and the circuits in the non-selected condition surpass in number those in the selected condition.

SUMMARY OF THE INVENTION

It is the primary object of the present invention to provide a method of substantially reducing power consumption of a decoder circuit on the basis of the concept that a load of a NOR gate which selects addresses is electrically not connected when the circuit including the NOR gate does not select the word line.

The present invention is directed to a decoder circuit for a semiconductor memory device including a logic circuit for receiving an address signal as an input thereto and selecting an address in response thereto and a load in the logic circuit. The load comprises a pair of transistors connected in parallel, wherein one of the pair of transistors turns ON for a specified period in synchronization with the address signal, and the other of the pair of transistors turns ON when the logic circuit is in a selected condition and turns OFF when the logic circuit is in a non-selected condition.

BRIEF DESCRIPTION OF THE DRAWINGS

FIGS. 7A–7I show the waveforms for explaining the circuit of FIG. 6.

DETAILED DESCRIPTION OF THE PREFERRED EMBODIMENTS

Figure 1:
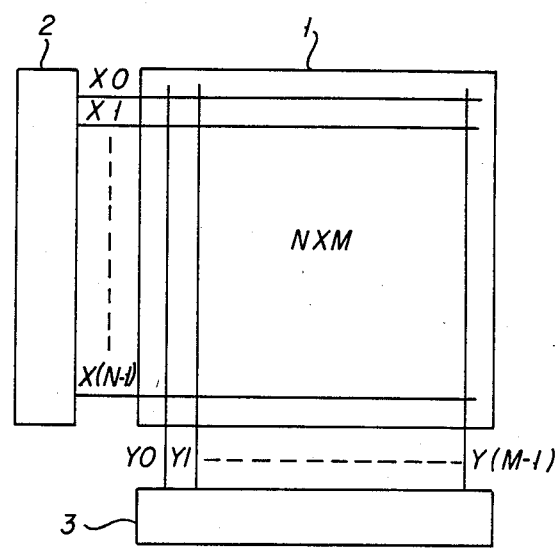
FIG. 1 is an outline of a typical static type semiconductor memory device.
Figure 2:
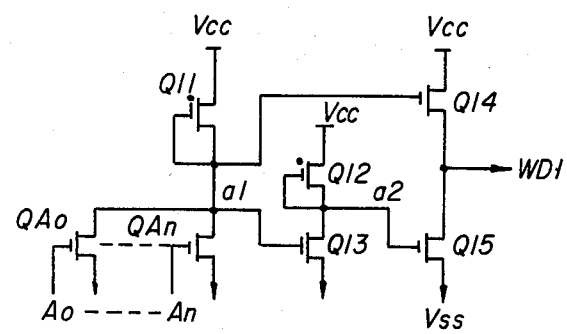
FIG. 2 is a schematic diagram of a decoder circuit of a conventional semiconductor memory device.
Figure 3:
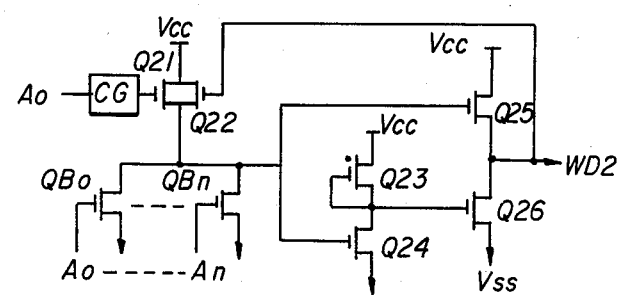
FIG. 3 is a schematic diagram of a decoder circuit of a semiconductor memory device of the first embodiment of the present invention.

The schematic diagram of a decoder circuit of a semiconductor memory device in a first embodiment of the present invention is shown in FIG. 3, in which signals $A_0$ to $A_n$ are address input signals and are respectively connected to the gates of transistors $QB_0$ to $QB_n$ forming a NOR gate. The sources of transistors $QB_0$ to $QB_n$ are connected to the return side line $V_{ss}$ of the power supply, while the drains are connected together and are connected to the power supply $V_{cc}$ via the first transistor $Q_{21}$ and the second transistor $Q_{22}$ which are the load. The load transistors $Q_{21}$ and $Q_{22}$ are connected in parallel and an output of the clock signal generating circuit CG is supplied to the gate of transistor $Q_{21}$. The output of the NOR gate is applied to the gate of transistor $Q_{24}$ operating as the inverter, and the source of transistor $Q_{24}$ is connected to $V_{ss}$ while the drain is connected to $V_{cc}$ via a depletion type MOS transistor $Q_{23}$ which is connected as a load. An output of transistor $Q_{24}$ is supplied to the gate of transistor $Q_{26}$ in the output circuit. The source of transistor $Q_{26}$ is connected to $V_{ss}$, while the drain is connected to the source of transistor $Q_{25}$ of the output circuit. The point connecting the drain of transistor $Q_{26}$ and the source of transistor $Q_{25}$ is extended to external circuits as the output WD 2 of the decoder circuit and is also extended to the gate of the second transistor $Q_{22}$. The drain of transistor $Q_{25}$ is connected to $V_{cc}$, while the gate thereof is connected to the output of the NOR gate.

Figure 5A:
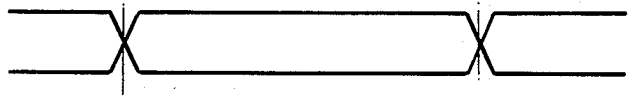
FIGS. 5A–5G illustrate the waveforms of the circuits in FIG. 3 and FIG. 4.
Figure 5B:
Figure 5C:
Figure 5D:
Figure 5E:
Figure 5F:
Figure 5G:

The operation of the circuit will now be explained in detail. When an address signal varies, the clock generating circuit CG turns ON and generates a clock signal which remains at a high level for a certain short period of time. FIG. 5A shows the waveforms of the address signal and its inverted signal and FIG. 5B shows a waveform of the clock signal. The clock signal generating circuit CG receives, for example, the address input signal $A_0$, inverts polarity through the inverter and provides an output through an AND operation of the signal delayed by a capacitor and the original signal $A_0$ or by use of the circuit shown in FIG. 6, for example. When all of the address input signals $A_0$ to $A_n$ are at a low level, the NOR gate is, if the clock signal is at a high level, at a high level since a load is formed by the first transistor $Q_{21}$. When the output of the NOR gate becomes high, the output of the transistor $Q_{24}$, namely, the gate of transistor $Q_{26}$ is at a low level, the gate of transistor $Q_{25}$ becomes high, causing the transistor $Q_{25}$ to turn ON while the transistor $Q_{26}$ turns OFF. Therefore, the output WD 2 becomes high driving the word line. Simultaneously, the output WD 2 turns ON the transistor $Q_{22}$, forming a load of the NOR gate. Even when the clock signal becomes low and the transistor $Q_{21}$ turns OFF, operation of the NOR gate is maintained, holding the word line selecting condition in the decoder. FIG. 5C shows the waveform of an address input signal, while FIG. 5D shows the NOR gate output, FIG. 5E shows the inverter output and FIG. 5G shows the output of WD 2.

If at least one of the address input signals $A_0$ to $A_n$ is at a high level, an output of the NOR gate is at a low level, while the output of the inverter is at a high level only when the clock signal is at a high level, executing the same operation as that of the conventional circuit. Thereby, the output WD 2 is at a low level and the word line is in a non-selected condition. Shifting to the low level of the clock signal causes a DC current to flow only into the transistor $Q_{23}$ in the selected condition since the load of the NOR gate is not electrically connected, thus drastically reducing consumption. Therefore, the duration time of the clock signal at a high level should be set to a sufficiently shorter period than that when the memory cell is selected and thereby power consumption of the decoder circuit is the non-selected condition of the word line can be reduced tremendously.

Figure 4:
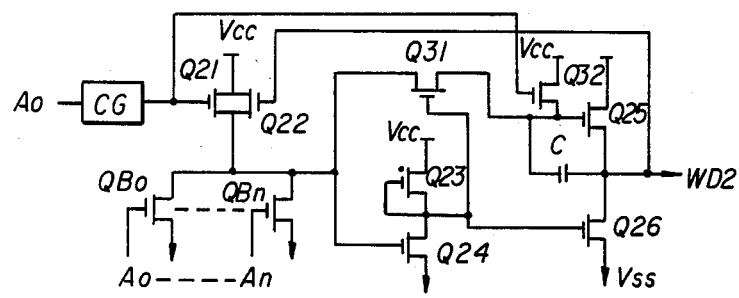
FIG. 4 is a schematic diagram of a second embodiment of the present invention.

A schematic diagram of a second embodiment of the present invention is shown in FIG. 4. The circuit of FIG. 4 is similar to the circuit of FIG. 3, except for the following three differences: First, the third transistor $Q_{31}$ is provided between the output of the NOR gate and the gate of transistor $Q_{25}$ of the output circuit with the inverter output being supplied to the gate of transistor $Q_{31}$; second, the gate of transistor $Q_{25}$ is connected to the power supply $V_{cc}$ via a fourth transistor $Q_{32}$ and an output of the clock generator is supplied to the gate of transistor $Q_{32}$; and third, a capacitor C is connected between the output of the output circuit and the gate of transistor $Q_{25}$. A combination of the capacitor C and the fourth transistor $Q_{32}$ enables, because of a bootstrap effect, a high speed rise in the output signal as compared with the conventional circuit, thus realizing a high speed drive of the memory cells. The third transistor $Q_{31}$ electrically disconnects the output of the NOR gate and the gate of transistor $Q_{25}$ of the output circuit, when the inverter output is at a low level, promoting the bootstrap effect. FIG. 5F shows the waveform at the gate of transistor $Q_{25}$. Other operations of the circuit in FIG. 4 are the same as those of the circuit in FIG. 3 and further explanation is, therefore, omitted here. Referring to FIG. 4, the same elements which perform the same functions as those used in the circuit of FIG. 3 are given the same reference symbols.

Figure 6:
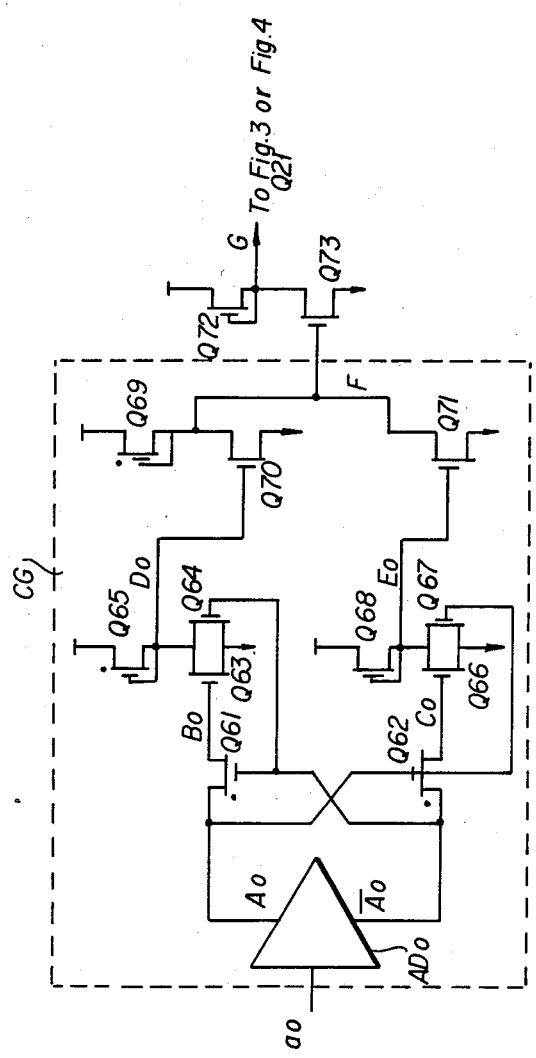
FIG. 6 shows the structure of the clock generating circuit CG in FIG. 3 and FIG. 4.
Figure 7A:
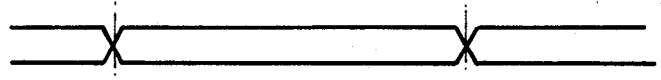

FIG. 6 shows the structure of the clock generating circuit CG of the embodiments in FIG. 3 and FIG. 4. In FIG. 6, $a_0$ is the address signal input terminal, $AD_0$ is the address buffer, $Q_{61}$, $Q_{62}$, $Q_{65}$, $Q_{68}$, $Q_{69}$, $Q_{72}$ are depletion type MOS transistors, $Q_{63}$, $Q_{64}$, $Q_{66}$, $Q_{67}$, $Q_{70}$, $Q_{71}$, $Q_{73}$ are enhancement type MOS transistors. FIG. 7 shows the operation time chart indicating waveforms at respective points of the clock generating circuit CG of FIG. 6 where $A_0$, $\overline{A}_0$, ... G are waveforms at respective points $A_0$, $\overline{A}_0$, ... G of FIG. 6. As shown in FIG. 7A, when the address signal varies and it is applied to the address signal input terminal $a_0$, it is held by the address buffer $AD_0$, causing the outputs $A_0$, $\overline{A}_0$ of the address buffer $AD_0$ to vary as shown in FIG. 7A. Since the transistors $Q_{61}$, $Q_{62}$ are depletion type MOS transistors, the outputs $A_0$, $\overline{A}_0$ appear at the gate of transistors $Q_{63}$ and $Q_{66}$. The transistors $Q_{61}$ and $Q_{62}$ form a delayed inverter providing a slow rise time with structure which provides a fast fall time. Therefore, the waveforms of $B_0$, $C_0$ change as shown in FIG. 7D and FIG. 7E.

The drain $D_0$ of transistor $Q_{65}$ remains at a high level until the transistor $Q_{63}$ turns OFF ($\overline{A}_0$ is at a LOW state) and the transistor $Q_{64}$ turns ON ($B_0$ rises to a HIGH state). In the same way, the drain $E_0$ of transistor $Q_{68}$ remains at a high level until the transistor $Q_{66}$ turns OFF ($A_0$ is at a LOW state) and the transistor $Q_{67}$ turns ON ($C_0$ rises to a HIGH state). These waveforms are shown in FIGS. 7F and 7G. These signals are combined by the transistors $Q_{69}$, $Q_{70}$, and $Q_{71}$, and the waveform at the point F changes as shown in FIG. 7H and then is inverted by the final stage transistors $Q_{72}$ and $Q_{73}$. Thereby the pulse G having the desired duration of time can be obtained at the point where the address signal of (a) varies as shown in FIG. 7G.

The pulse G is then applied to the gate of transistor $Q_{21}$ shown in FIG. 3 and FIG. 4.

According to the present invention, as explained above, an excellent effect can be obtained when the current which may flow into the transistor circuit can be reduced during the non-selected condition of the word line and power consumption in the decoder circuit can be reduced drastically.

Moreover, the clock generating circuit of FIG. 6 assures the feature that the clock pulse in the final stage can be delayed more quickly and without a capacitor by inputting the outputs A, $\overline{A}$ of the address buffer into the delayed inverter and by providing a slow rise time or very fast fall time for the outputs $B_0$ or $C_0$ of the delayed inverter.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than the foregoing description, and all changes which come within the meaning and range of equivalency of the claims are, therefore, to be embraced therein.

What is claimed is:

1. A decoder circuit for a semiconductor memory device having addresses corresponding to the location of data therein, said decoder circuit comprising: power supply means; a logic circuit means comprising a NOR gate for receiving an address signal as the input thereto, an inverter means for receiving the output of said NOR gate, and an output circuit for receiving the output of said NOR gate and the output of said inverter means and for providing an output in response thereto, said output circuit being connected to said power supply means; a load means in said logic circuit means, said load means comprising a first pair of first and second transistors connected in parallel said first and second transistors being connected to said power supply means; and a clock signal generating means for generating a clock signal in response to a variation in the address signal, the clock signal having a specified time duration, said clock signal generating means being connected to said first transistor and said second transistor being connected to the output of said output circuit; wherein said first transistor turns ON for the specified time duration in synchronization with said address signal, and said second transistor turns ON when said logic circuit means is in a selected condition and turns OFF when said logic circuit means is in a non-selected condition.

2. A decoder circuit for a semiconductor memory device as claimed in claim 1, wherein said clock signal generating means comprises an address buffer which outputs the address signal and an inverted signal of the address signal and delayed inverter means respectively connected to both outputs of said address buffer; the output of said delayed inverter means being applied to said first transistor.

3. A decoder circuit for a semiconductor memory device as claimed in claim 2, wherein said clock signal generating means further comprises second and third pairs of transistors connected in parallel, said second and third pairs of transistors being connected respectively to said delayed inverter means; NOR circuits connected to the outputs of said second and third pair of transistors; and an inverter circuit connected to said NOR circuits; wherein the output of said inverter circuit is applied to said second transistor.

4. A decoder circuit for a semiconductor memory device as claimed in claim 1 further comprising bootstrapping means comprising a third transistor connected between said NOR gate and said output circuit; a fourth transistor connected between the connection of said output circuit and said third transistor, and a capacitor connected between the connection of said output circuit and said third transistor, and the output of said output circuit.

5. A decoder circuit for a semiconductor memory device as claimed in claim 4, wherein the output of said clock generating means is applied to the gate of said fourth transistor, and the output of said inverter means is applied to the gate of said third transistor.

* * * * *